United States Patent
Zhang

(10) Patent No.: US 12,258,273 B2
(45) Date of Patent: Mar. 25, 2025

(54) ORGANIC ELECTROLUMINESCENT DEVICE, METHOD OF PREPARING CONDUCTIVE FILM MATERIAL, AND DISPLAY PANEL

(71) Applicant: Wuhan China Star Optoelectronics Semiconductor Display Technology Co., Ltd., Wuhan (CN)

(72) Inventor: Yue Zhang, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 788 days.

(21) Appl. No.: 16/488,603

(22) PCT Filed: Jul. 5, 2019

(86) PCT No.: PCT/CN2019/094795
§ 371 (c)(1),
(2) Date: Oct. 10, 2021

(87) PCT Pub. No.: WO2020/199407
PCT Pub. Date: Oct. 8, 2020

(65) Prior Publication Data
US 2022/0024770 A1  Jan. 27, 2022

(30) Foreign Application Priority Data
Mar. 29, 2019 (CN) .......................... 201910249018.8

(51) Int. Cl.
*C01B 32/198* (2017.01)
*H10K 50/81* (2023.01)
(Continued)

(52) U.S. Cl.
CPC ........ *C01B 32/198* (2017.08); *C01P 2006/60* (2013.01); *C01P 2006/80* (2013.01);
(Continued)

(58) Field of Classification Search
CPC .................................................... C01B 32/198
See application file for complete search history.

(56) References Cited

U.S. PATENT DOCUMENTS

| 2013/0082234 A1* | 4/2013 | Bao .................. H10K 30/20 438/57 |
| 2016/0005988 A1* | 1/2016 | Lee .................. H10K 50/17 427/64 |
| 2016/0372671 A1 | 12/2016 | Wu et al. | |

FOREIGN PATENT DOCUMENTS

| CN | 103400940 | 11/2013 |
| CN | 103496691 | 1/2014 |

(Continued)

OTHER PUBLICATIONS

Fu et al. "Evaluation and Characterization of Reduced Graphene Oxide Nanosheets as Anode Materials for Lithium-Ion Batteries", International Journal of Electrochemical Science, 8(5): 6269-6280, Published Online May 1, 2013.
(Continued)

*Primary Examiner* — Douglas M Menz
(74) *Attorney, Agent, or Firm* — PV IP PC; Wei Te Chung

(57) ABSTRACT

An organic electroluminescent device having an anode, wherein the anode comprises at least one first layer, the first layer being made of partially reduced graphene oxides.

13 Claims, 2 Drawing Sheets

(51) Int. Cl.
    *H10K 50/84*     (2023.01)
    *H10K 71/00*     (2023.01)
    *H10K 102/00*    (2023.01)

(52) U.S. Cl.
    CPC ............ *H10K 50/81* (2023.02); *H10K 50/84* (2023.02); *H10K 71/00* (2023.02); *H10K 2102/00* (2023.02)

(56) References Cited

FOREIGN PATENT DOCUMENTS

| CN | 105390183 | 3/2016 |
|----|-----------|--------|
| CN | 106842725 | 6/2017 |
| CN | 105839078 | 8/2018 |
| CN | 108455572 | 8/2018 |

OTHER PUBLICATIONS

Kim et al. "Fabrication and Properties of Flexible OLEDs on Polyimide-Graphene Composite Film Substrate", Molecular Crystals and Liquid Crystals, 584(1):153-160, Published Online Dec. 16, 2013.

Li et al. "Inkjet-Printed Highly Conductive Transport Patterns With Water Based Ag-Doped Graphene", Journal of Materials Chemistry A, 2: 19095-19101, Published Online Sep. 19, 2014 & Supplementary Material.

\* cited by examiner

ORGANIC ELECTROLUMINESCENT DEVICE, METHOD OF PREPARING CONDUCTIVE FILM MATERIAL, AND DISPLAY PANEL

RELATED APPLICATIONS

This application is a National Phase of PCT Patent Application No. PCT/CN2019/094795 having International filing date of Jul. 5, 2019, which claims the benefit of priority of Chinese Patent Application No. 201910249018.8 filed on Mar. 29, 2019. The contents of the above applications are all incorporated by reference as if fully set forth herein in their entirety.

FIELD AND BACKGROUND OF THE INVENTION

The present invention relates to a field of display technology, and in particular, to an organic electroluminescence device and a method of preparing a conductive film material used in the organic electroluminescence device and a display panel employing the organic electroluminescence device.

Organic light-emitting diode (OLED) is considered to be the most promising new generation of display technology due to its excellent characteristics such as self-illumination, low energy consumption, wide viewing angles, rich colors, fast response times and capability of preparing a flexible screen.

FIG. 1 is a schematic structural view of a conventional organic electroluminescent device. As shown in FIG. 1, the conventional organic electroluminescent device includes, in order from bottom to top, a substrate 1, an anode 2, an organic light-emitting layer 3, and a cathode 4. The substrate 1 is usually a hard-screen glass substrate, and the anode 2 is usually an indium tin oxide (ITO) layer. Alternatively, as shown in FIG. 1, the anode 2 includes a first ITO layer 21, a metallic silver layer 22, and a second ITO layer.

With the impact of the internet and the internet of things, smart life of big connection era has quickly come to consumers. New display technology has ushered in era of "ubiquitous display" in the promotion of integration with mobile internet and smart internet. Therefore, there is an increasing demand for flexible display and transparent display. However, as resources of ITO raw materials become more and more scarce, manufacturing cost of display devices using ITO is becoming higher and higher. In addition, ITO is not widely used in flexible displays because it is brittle and not resistant to acid and brittle.

Therefore, there is an urgent need to provide a novel organic electroluminescent device to overcome the above drawbacks.

SUMMARY OF THE INVENTION

An object of the present invention is to provide an organic electroluminescent device with partially reduced graphene oxides as an electrode material, which have excellent electrical and optical properties and ultra-large sums of specific surface areas, so that the organic electroluminescent device can be widely used in the flexible displays. In addition, in the present invention, the partially reduced graphene oxides have outstanding thermal conductivity, which is utilized to effectively conduct internal heat of the organic electroluminescent device, thereby effectively extending service life of the organic electroluminescent device.

In order to achieve the above object, an aspect of the present invention provides an organic electroluminescent device having an anode, wherein the anode includes at least one first layer made of partially reduced graphene oxides.

In an embodiment of the present invention, the anode includes two first layers, and a metallic silver layer interposed between the two first layers.

In an embodiment of the present invention, the organic electroluminescent device further includes a cathode and an emission layer interposed between the anode and the cathode.

In an embodiment of the present invention, the organic electroluminescent device further includes at least one organic layer selected from one of a hole injection layer, a hole transport layer, an electron transport layer, and an electron injection layer.

In a preferred embodiment of the present invention, the organic electroluminescent device includes a hole injection layer and/or a hole transport layer, and the hole injection layer and/or hole transport layer is disposed between the anode and the emission layer. Preferably, when the organic electroluminescent device includes a hole injection layer and a hole transport layer, the hole injection layer is disposed between the anode and the emission layer, and the hole transport layer is disposed between the hole injection layer and the emission layer.

In a preferred embodiment of the present invention, the organic electroluminescent device includes an electron transport layer and/or an electron injection layer, and the electron transport layer and/or an electron injection layer is disposed between the emission layer and the cathode. Preferably, when the organic electroluminescent device includes an electron transport layer and an electron injection layer, the electron transport layer is disposed between the emission layer and the cathode, and the electron injection layer is disposed between the electron transport layer and the cathode.

It will be understood by those skilled in the art that, unless otherwise specified, the functional layers of the organic electroluminescent device of the present invention are formed by conventional materials in the art by conventional techniques in the art. In addition, some functional layers can be introduced or removed according to actual process requirements. In addition, the organic electroluminescent device of the present invention may further includes a conventional encapsulation layer in the art.

Another aspect of the present invention provides a method of preparing a conductive film material including: a step of preparing graphene oxides; and a step of preparing an organic dispersion of partially reduced graphene oxides.

In an embodiment of the present invention, the step of preparing graphene oxides includes: S101: the step of preparing graphene oxides includes: S101: adding flake graphite and sodium nitrate to concentrated sulfuric acid to form a reaction system, followed by stirring in ice water bath; S102: adding potassium permanganate to the reaction system, followed by stirring in ice water bath; S103: allowing the reaction system to react at a moderate temperature in a 36° C. water bath, followed by slowly adding high purity water to the reaction system; S104: after sufficiently stirring at a temperature of 98° C. in a boiling water bath, terminating the reaction by adding high-purity water; S105: oxidizing residual oxide in the reaction system by hydrogen peroxide; and S106: washing the reaction system until no sulfate ion is detected, followed by evaporating and drying to obtain graphene oxides.

In an embodiment of the present invention, in the steps S101 and S102, a concentration of the concentrated sulfuric acid is 98%, and the flake graphite, the sodium nitrate, and the potassium permanganate have a mass ratio of 2:1:9, and 4 g of flake graphite is provided per 100 ml of the concentrated sulfuric acid; in the step S103, slowly adding high-purity water to the reaction system based on a condition of 90 ml of high-purity water per gram of the flake graphite; and, in the step S106, centrifugally washing the reaction system with hydrochloric acid until no sulfate ion is detected.

In an embodiment of the present invention, the step of preparing the organic dispersion of partially reduced graphene oxides includes: S201: sufficiently dispersing graphene oxides in N-methylpyrrolidone; S202: adding ascorbic acid to the reaction system for carrying out a reduction reaction under ultrasonic or magnetic stirring; and S203: allowing the reaction system to stand for carrying out a reduction reaction to obtain the organic dispersion of the partially reduced graphene oxides.

In an embodiment of the present invention, in the step S201, 10 mg of graphene oxides are dispersed per 100 ml of N-methylpyrrolidone; and in the step S202, the ascorbic acid and graphene oxides have a mass ratio of 1:1.

Another aspect of the present invention further provides a method of preparing the above organic electroluminescent device, including: a step of providing a film-forming substrate; a step of preparing a conductive film material; and a step of forming an anode on the film-forming substrate.

In an embodiment of the present invention, in the step of forming an anode on the film-forming substrate, the obtained organic dispersion of partially reduced graphene oxides is spin-coated on the film-forming substrate by vacuum spin coating, followed by baking to obtain an anode.

In an embodiment of the present invention, the method of fabricating the organic electroluminescent device further includes a step of etching the obtained anode.

In an embodiment of the present invention, the method of fabricating the organic electroluminescent device further includes a step of forming the emission layer on the anode, and a step of forming the cathode on the emission layer.

Another aspect of the present invention still provides a display panel including: a substrate and a plurality of any one of the above organic electroluminescent devices disposed on a surface of the substrate.

In an embodiment of the present invention, the display panel further includes other known structures such as a thin film encapsulation layer and a package cover etc.

In an embodiment of the present invention, the substrate is a flexible substrate made of polyethylene terephthalate. Alternatively, in an embodiment of the present invention, the substrate includes a flexible substrate made of polyethylene terephthalate.

Experiments have shown that the single-layered partially reduced graphene oxides have a transmittance of 97.7% and a thermal conductivity of 5000 W/m·K (about 10 times that of a metal material), so that the electrode made of such materials has excellent performance in terms of electrical and optical properties. Therefore, the organic electroluminescent device described in the present invention can be widely used in flexible displays.

In addition, in the present invention, the outstanding thermal conductivity of the partially reduced graphene oxides is utilized to effectively conduct the internal heat of the organic electroluminescent device, thereby effectively extending service life of the organic electroluminescent device.

BRIEF DESCRIPTION OF THE SEVERAL VIEW OF THE DRAWINGS

DETAILED DESCRIPTION OF PREFERRED-SPECIFIC EMBODIMENTS OF THE INVENTION

Hereinafter, the technology of the present invention will be described in detail in conjunction with specific embodiments. It should be understood that the following specific embodiments are only used to assist those skilled in the art to understand the present invention and not to limit the present invention.

The following description of the embodiments is intended to be illustrative of the specific embodiments. The directional terms mentioned in this application, such as "upper", "lower", "before", "after", "left", "right", "top", "bottom", etc., are only referred to as additional schematic direction. Therefore, the directional terminology used is for the purpose of illustration and understanding, and is not intended to be construed as limiting the present invention.

Embodiment 1. Organic Electroluminescent Device 100

Figure 1:
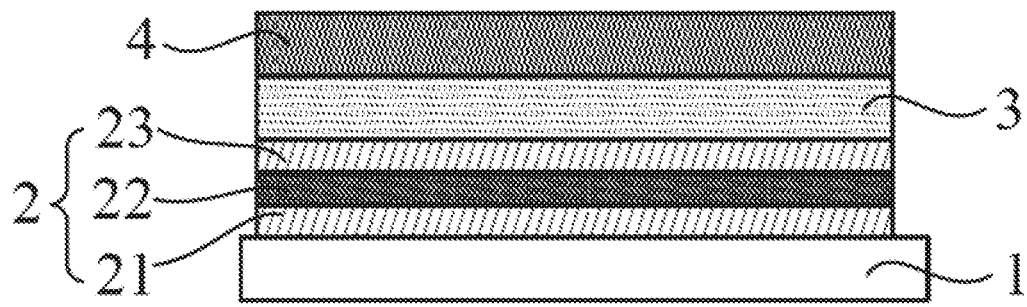
FIG. 1 is a schematic structural view of a conventional organic electroluminescent device.
Figure 2:
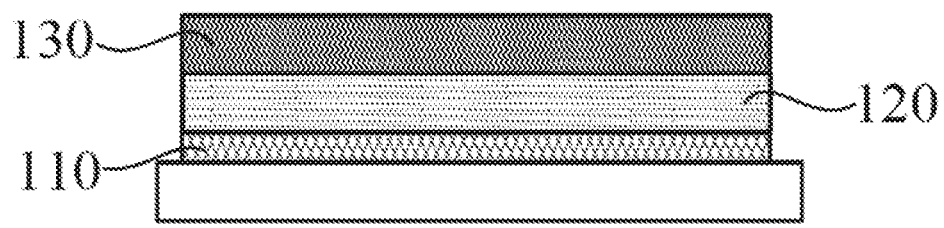
FIG. 2 is a schematic structural view of an organic electroluminescent device according to an embodiment of the present invention.

In the present embodiment, an organic electroluminescent device 100 is provided. As shown in FIG. 2, the organic electroluminescent device 100 includes an anode 110, an emission layer 120 disposed on the anode 110, and a cathode 130 disposed on the emission layer 120.

In the present embodiment, the anode 110 is made of partially reduced graphene oxides.

A method of preparing the anode 110 material includes: a step of preparing graphene oxides and a step of preparing an organic dispersion of partially reduced graphene oxides. Hereinafter, a method of preparing the anode 110 will be described in detail. It will be understood by those skilled in the art that the following preparation methods are for illustrative purposes only and are not to be construed as limiting the present invention.

In this embodiment, graphene oxides are prepared using a modified Hummer's method. The specific steps are as follows:

1) weighing 1 g of flake graphite, 0.5 g of sodium nitrate (NaNO3), and 4.5 g of potassium permanganate (KMnO4);
2) placing 25 ml of 98% concentrated sulfuric acid (H2SO4) in a 250 ml three-necked flask;
3) providing an ice water bath, placing the three-necked flask into the ice water bath for magnetically stirring for 10 minutes;

4) sequentially pouring the flake graphite and sodium nitrate (NaNO3) into the three-necked flask in small portions, and stirring for 0.5 h;
5) slowly adding 4.5 g of potassium permanganate (KMnO4) to the three-necked flask within 1 h, followed by stirring for 0.5 h;
6) magnetically stirring the three-necked flask for 2 h in a 36° C. warm water bath;
7) after the reaction at the moderate temperature is finished, slowly pouring the purple-green mixed solution in the three-necked flask into 90 ml of high-purity water, followed by pouring the mixed solution back into the original three-necked flask;
8) transferring the three-necked flask containing the mixed solution to a boiling water bath at 98° C. for magnetically stirring for 18 minutes;
9) slowly adding 60 ml of high purity water to terminate the reaction;
10) slowly adding 25 ml of 30% hydrogen peroxide (H2O2) to reduce residual oxide;
11) after 15 minutes, adding 40 ml of 10% dilute hydrochloric acid (HCl);
12) centrifugally washing the obtained mixed solution several times until it is detected to have a pH of about 7, and no sulfate ion (SO42-) is detected by the barium chloride (BaCl2) solution;
13) transferring the obtained brownish yellow viscous material to a Teflon evaporating dish, followed by drying at 45° C. for 24 hours to obtain the graphite oxides.

The graphene oxides prepared by the method has the advantages of good quality, no impurities, high yield, and low cost etc.

In this embodiment, an organic dispersion of the partially reduced graphene oxides is further prepared by a two-step reduction method, and the specific steps are as follows:
1) weighing and placing 10 mg of graphene oxides in a beaker;
2) adding 30 ml of N-methylpyrrolidone (NMP) to the beaker, sealing the beaker, and alternately carrying out ultrasonic stirring and magnetic stirring, to sufficiently disperse the graphene oxides in N-methylpyrrolidone;
3) adding 10 mg of ascorbic acid, followed by ultrasonic or magnetic stirring for 30 minutes;
4) left standing for 24 h, wherein the solution gradually darkens to obtain the organic dispersion of the partially reduced graphene oxides.

The concentration of the obtained organic dispersion of the partially reduced graphene oxides was determined to be 1 mg/ml.

In this embodiment, the method of fabricating the organic electroluminescent device 100 includes the steps of: providing a film-forming substrate; preparing the anode 110 material; and forming the anode 110 on the film-forming substrate. In the step of forming the anode on the film-forming substrate, the obtained organic dispersion of the partially reduced graphene oxides is spin-coated on the film-forming substrate by vacuum spin coating, followed by baking to obtain the anode 110.

It will be understood by those skilled in the art that the obtained anode 110 can also be etched to have a specific shape.

Further, the method of fabricating the organic electroluminescent device 100 further includes forming the emission layer 120 on the anode 110, and forming the cathode 130 on the emission layer 120.

The emission layer 120 includes any luminescent material known in the art that is formed on the anode 110 by a manner known in the art.

The cathode 130 is made of a metal having a lower work function such as lithium, magnesium, calcium, barium, aluminum, or indium, or their alloys with copper, gold, or silver. For example, the alloys may include, but are not limited to, Al and Mg/Ag alloy. Alternatively, the cathode 330 may be an electrode layer formed by alternately forming a metal and a metal fluoride, such as, but not limited to, an electrode layer composed of lithium fluoride and an Al layer which are sequentially laminated. Of course, the cathode 130 may also be made of ITO or IZO. Also, the cathode 130 may be formed by vacuum thermal evaporation.

It can be understood by those skilled in the art that the film-forming substrate can be selected from one of a glass substrate, a polyimide substrate, and a film substrate depending on specific applications. The structures prepared in a number of processes may be formed on the film-forming substrate, such as an inorganic layer, a plurality of layers in a thin film transistor structure, or a completed thin film transistor and a trace, which vary from stage to stage throughout the process specifically according to the layers to be formed.

Embodiment 2. Organic Electroluminescent Device 200

Figure 3:
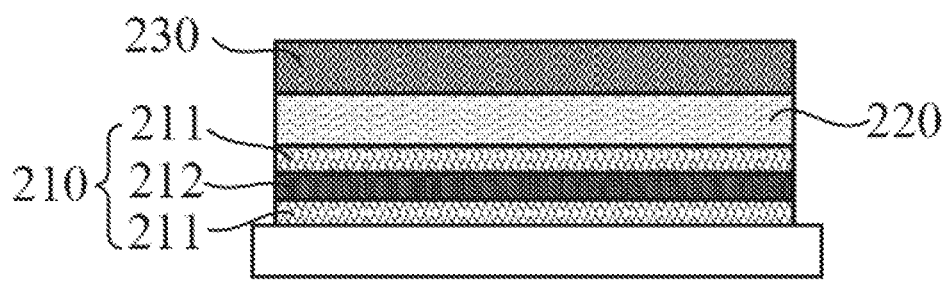
FIG. 3 is a schematic structural view of an organic electroluminescent device according to another embodiment of the present invention.

In the present embodiment, an organic electroluminescent device 200 is provided. As shown in FIG. 3, the organic electroluminescent device 200 includes an anode 210, an emission layer 220 disposed on the anode 210, and a cathode 230 disposed on the emission layer 220.

Different from the organic electroluminescent device 100 described in Embodiment 1, the anode 210 of the organic electroluminescent device 200 of the present embodiment includes two first layers 211 of partially reduced graphene oxides, and a metallic silver layer 212 interposed between the two first layers 211.

The method of preparing the partially reduced graphene oxides and the method of fabricating the organic electroluminescent device 200 are the same as those of Embodiment 1, and are not repeated herein for brevity.

Embodiment 3. Organic Electroluminescent Device 300

Figure 4:
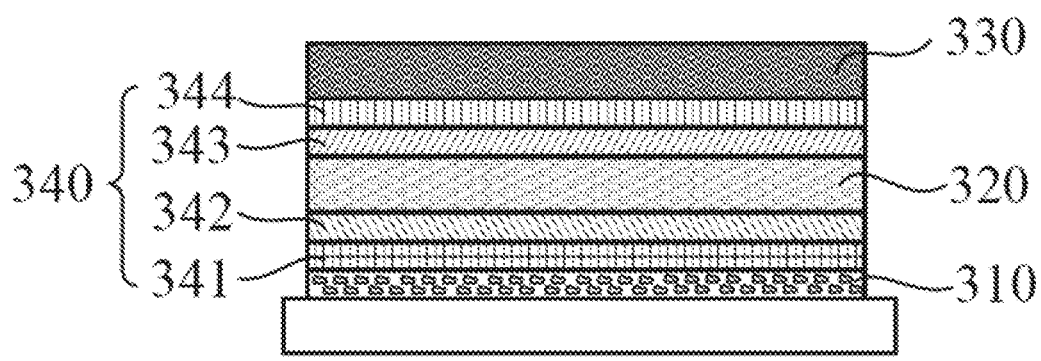
FIG. 4 is a schematic structural view of an organic electroluminescent device according to another embodiment of the present invention.

In the present embodiment, an organic electroluminescent device 300 is provided. As shown in FIG. 4, the organic electroluminescent device 300 includes an anode 310, an emission layer 320 disposed on the anode 310, and a cathode 330 disposed on the emission layer 320.

In the present embodiment, the anode 310 may have the same structure as the anode 110 described in Embodiment 1, or may have the same structure as the anode 210 described in Embodiment 2.

In the organic electroluminescent device 300 of the present embodiment, at least one organic layer 340 may be included, such as a hole injection layer, a hole transport layer, an electron transport layer, or an electron injection layer.

As shown in FIG. 4, the organic electroluminescent device 300 includes a hole injection layer 341 disposed between the anode 310 and the emission layer 320, a hole transport layer 342 disposed between the hole injection layer 341 and the emission layer 320, an electron transport layer 343 disposed between the emission layer 320 and the cathode 330, and an electron injection layer 344 disposed between the electron transport layer 343 and the cathode 330.

It will be understood by those skilled in the art that the materials used in each of the above-mentioned layers are known in the art, and the specific selection of these materials does not impact the implementation of the technical solutions and the obtaining of technical effects of the present invention.

The electron injection layer 344 may be made of, for example, but not limited to, ZnO, TiO2, or Cs2CO3, and formed by vacuum thermal evaporation.

The electron transport layer 343 may be made of, for example, but not limited to, 4,7-diphenyl-1,10-phenanthroline (Bphen) or 1,3,5-tris(N-phenylbenzimidazol-2-yl)benzene (TPBi), and formed by vacuum thermal evaporation.

The hole transport layer 342 may be made of, for example, but not limited to, an aromatic diamine compound, an aromatic triamine compound, a carbazole compound, a triphenylamine compound, a furan compound, or a compound having a spiral structure, and formed by vacuum thermal evaporation.

Embodiment 4. Display Panel

Figure 5:
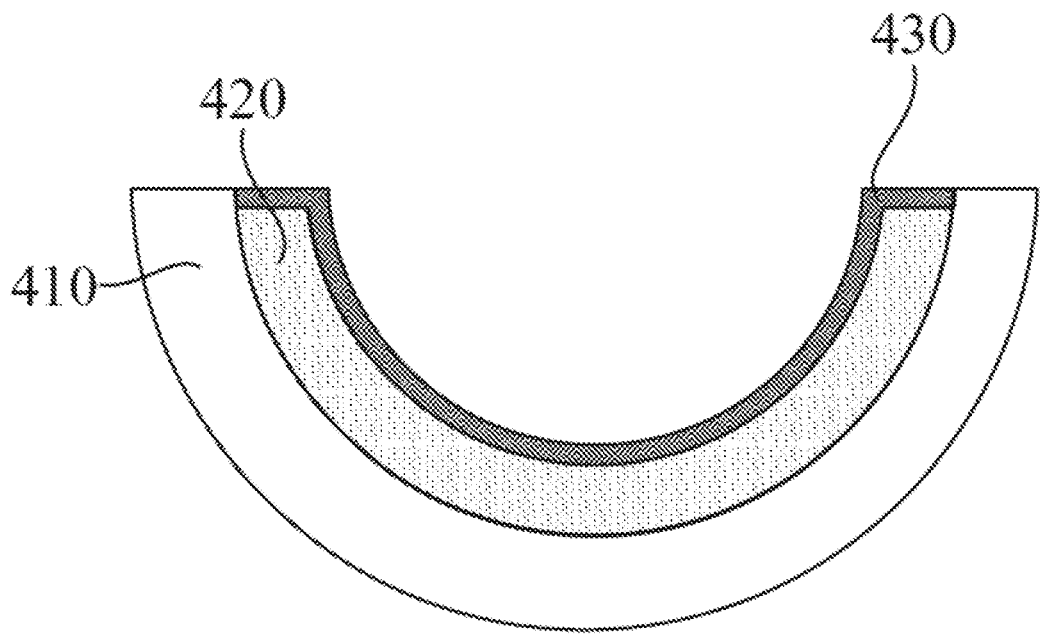
FIG. 5 is a schematic structural diagram of a display panel according to an embodiment of the present invention.

In the present embodiment, a display panel 400 is provided. As shown in FIG. 5, the display panel 400 includes a substrate 410 and a light-emitting device layer 420 formed on the substrate 410. Of course, the display panel 400 further includes other known structures such as a thin film encapsulation layer and a package cover. For example, as shown in FIG. 5, the display panel 400 further includes a conventional thin film encapsulation layer 430.

The light-emitting device layer 420 may include a plurality of organic electroluminescent devices 100 described in Embodiment 1, a plurality of the organic electroluminescent devices 200 described in Embodiment 2, or a plurality of the organic electroluminescent devices 300 described in Embodiment 3.

It can be understood by those skilled in the art that the substrate 410 can be selected from one of a glass substrate, a polyimide substrate, and a film substrate, and the structures prepared in a number of processes may be formed on the substrate 410, such as an inorganic layer, a plurality of layers in a thin film transistor structure, or a completed thin film transistor and a trace, which vary from stage to stage throughout the process specifically according to the layers to be formed.

In the present embodiment, the substrate 410 is made of polyethylene terephthalate. Of course, the substrate 410 may also include a flexible substrate made of polyethylene terephthalate, and a plurality of inorganic layers, a plurality of layers in the thin film transistor structure, or a completed thin film transistor and a trace formed on the flexible substrate.

Experiments have shown that the single-layered partially reduced graphene oxides have a transmittance of 97.7% and a thermal conductivity of 5000 W/m·K (about 10 times that of a metal material), so that the electrode made of such materials has excellent performance in terms of electrical and optical properties. Therefore, the organic electroluminescent device described in the present invention can be widely used in flexible displays.

In addition, in the present invention, the outstanding thermal conductivity of the partially reduced graphene oxides is utilized to effectively conduct the internal heat of the organic electroluminescent device, thereby effectively extending service life of the organic electroluminescent device.

The present invention has been described by the above related embodiments, but the above embodiments are merely examples for implementing the present invention. It must be noted that the disclosed embodiments do not limit the scope of the application. Rather, modifications and equivalent arrangements are intended to be included within the scope of the appended claims.

INDUSTRIAL APPLICABILITY

The subject matter of the present invention can be prepared and used in the industry with industrial applicability.

What is claimed is:

1. A display panel, comprising a substrate and at least one organic electroluminescent device disposed on a surface of the substrate, wherein the organic electroluminescent device has an anode, and the anode comprises two first layers and a metallic silver layer interposed between the two first layers, and each of the two first layers is made of partially reduced graphene oxides.

2. The display panel according to claim 1, wherein the organic electroluminescent device further comprises a cathode and an emission layer interposed between the anode and the cathode.

3. The display panel according to claim 2, wherein the organic electroluminescent device further comprises at least one organic layer selected from one of a hole injection layer, a hole transport layer, an electron transport layer, and an electron injection layer.

4. The display panel according to claim 1, further comprising a thin film encapsulation layer disposed on the organic electroluminescent device and covering the organic electroluminescent device.

5. A method of preparing the display panel according to claim 1, wherein the preparation method comprises:
    a step of providing a substrate;
    a step of preparing a conductive film material; and
    a step of forming an anode on a surface of the substrate;
    wherein the step of preparing a conductive film material comprises:
    a step of preparing graphene oxides; and,
    a step of preparing an organic dispersion of partially reduced graphene oxides.

6. The preparation method according to claim 5, wherein in the steps S101 and S102, a concentration of the concentrated sulfuric acid is 98%, and the flake graphite, the sodium nitrate, and the potassium permanganate have a mass ratio of 2:1:9, and 4 g of flake graphite is provided per 100 ml of the concentrated sulfuric acid; in the step S103, slowly adding high-purity water to the reaction system based on a condition of 90 ml of high-purity water per gram of the flake graphite; and, in the step S106, centrifugally washing the reaction system with hydrochloric acid until no sulfate ion is detected.

7. An organic electroluminescent device comprising an anode, a cathode, and an emission layer interposed between the anode and the cathode, wherein the anode comprises two first layers and a metallic silver layer interposed between the two first layers, and each of the two first layers is made of partially reduced graphene oxides.

8. The organic electroluminescent device according to claim 7, wherein the organic electroluminescent device further comprises at least one organic layer selected from one of a hole injection layer, a hole transport layer, an electron transport layer and an electron injection layer.

9. The organic electroluminescent device according to claim 8, wherein the organic layer is at least one of the hole transport layer and the hole injection layer; and at least one of the hole transport layer and the hole injection layer is disposed between the emission layer and the cathode.

10. The organic electroluminescent device according to claim 8, wherein the organic layer is at least one of the electron transport layer and the electron injection layer; and at least one of the electron transport layer and the electron injection layer is disposed between the emission layer and the cathode.

11. The preparation method according to claim 10, wherein the step of preparing graphene oxide comprises:
   S101: adding flake graphite and sodium nitrate to concentrated sulfuric acid to form a reaction system, followed by stirring in ice water bath;
   S102: adding potassium permanganate to the reaction system, followed by stirring in ice water bath;
   S103: allowing the reaction system to react at a moderate temperature in a 36° C. water bath, followed by slowly adding high purity water to the reaction system;
   S104: after sufficiently stirring at a temperature of 98° C. in a boiling water bath, terminating the reaction by adding high-purity water;
   S105: oxidizing residual oxide in the reaction system by hydrogen peroxide; and
   S106: washing the reaction system until no sulfate ion is detected, followed by evaporating and drying to obtain a graphene oxide.

12. The preparation method according to claim 10, wherein the step of preparing the organic dispersion of partially reduced graphene oxides comprises:
   S201: sufficiently dispersing graphene oxides in N-methylpyrrolidone;
   S202: adding ascorbic acid to the reaction system for carrying out a reduction reaction under ultrasonic or magnetic stirring; and
   S203: allowing the reaction system to stand for carrying out a reduction reaction to obtain the organic dispersion of the partially reduced graphene oxides.

13. The preparation method according to claim 6, wherein in the step S201, 10 mg of graphene oxides are dispersed per 100 ml of N-methylpyrrolidone; and in the step S202, the ascorbic acid and graphene oxide have a mass ratio of 1:1.

* * * * *